(12) United States Patent
Nakajima et al.

(10) Patent No.: US 8,168,375 B2
(45) Date of Patent: *May 1, 2012

(54) PATTERNING METHOD

(75) Inventors: Shigeru Nakajima, Yamanashi (JP);
Kazuhide Hasebe, Yamanashi (JP);
Pao-Hwa Chou, Yamanashi (JP);
Mitsuaki Iwashita, Yamanashi (JP);
Reiji Niino, Yamanashi (JP)

(73) Assignee: Tokyo Electron Limited, Tokyo (JP)

( * ) Notice: Subject to any disclaimer, the term of this patent is extended or adjusted under 35 U.S.C. 154(b) by 108 days.

This patent is subject to a terminal disclaimer.

(21) Appl. No.: 12/441,007

(22) PCT Filed: Jun. 6, 2008

(86) PCT No.: PCT/JP2008/060483
§ 371 (c)(1),
(2), (4) Date: Mar. 12, 2009

(87) PCT Pub. No.: WO2008/149989
PCT Pub. Date: Dec. 11, 2008

(65) Prior Publication Data
US 2010/0112496 A1    May 6, 2010

(30) Foreign Application Priority Data
Jun. 8, 2007 (JP) .................. 2007-153185

(51) Int. Cl.
*G03F 7/00* (2006.01)
*G03F 7/26* (2006.01)
*G03F 7/40* (2006.01)

(52) U.S. Cl. ............. 430/317; 430/270.1; 430/311; 430/312; 430/313; 430/330; 430/331; 430/322

(58) Field of Classification Search ............. 430/270.1, 430/311, 312, 313, 317, 273.1, 330, 331
See application file for complete search history.

(56) References Cited

U.S. PATENT DOCUMENTS

| | | | | |
|---|---|---|---|---|
| 6,894,357 | B2 * | 5/2005 | Guo | 257/410 |
| 7,189,652 | B1 | 3/2007 | Blosse et al. | |
| 7,300,885 | B2 * | 11/2007 | Hasebe et al. | 438/758 |
| 7,390,750 | B1 * | 6/2008 | Ramkumar et al. | 438/706 |

(Continued)

FOREIGN PATENT DOCUMENTS

JP    57-130431 A    8/1982

(Continued)

OTHER PUBLICATIONS

International Search Report for PCT/JP2008/060483 dated Jul. 1, 2008.

(Continued)

*Primary Examiner* — Amanda C. Walke
(74) *Attorney, Agent, or Firm* — Pearne & Gordon LLP

(57) ABSTRACT

Disclosed is a patterning method including: forming a first film on a substrate; forming a multi-layered film including a resist film on the first film; forming a patterned resist film having a preset pattern by patterning the resist film by photolithography; forming a silicon oxide film different from the first film on the patterned resist film and the first film by alternately supplying a first gas containing organic silicon and a second gas containing an activated oxygen species to the substrate; etching the silicon oxide film to thereby form a sidewall spacer on a sidewall of the patterned resist film; removing the patterned resist film; and processing the first film by using the sidewall spacer as a mask.

25 Claims, 13 Drawing Sheets

U.S. PATENT DOCUMENTS

| | | | |
|---|---|---|---|
| 7,605,095 B2 * | 10/2009 | Ikeuchi et al. | 438/787 |
| 7,666,578 B2 * | 2/2010 | Fischer et al. | 430/314 |
| 7,758,920 B2 * | 7/2010 | Hasebe et al. | 427/248.1 |
| 7,887,996 B2 * | 2/2011 | Liu et al. | 430/312 |
| 2003/0232514 A1 * | 12/2003 | Kim et al. | 438/791 |
| 2007/0049040 A1 | 3/2007 | Bai et al. | |
| 2009/0239382 A1 * | 9/2009 | Zhu | 438/696 |
| 2009/0311634 A1 * | 12/2009 | Yue et al. | 430/323 |
| 2010/0130015 A1 * | 5/2010 | Nakajima et al. | 438/703 |

FOREIGN PATENT DOCUMENTS

| | | |
|---|---|---|
| JP | 01-124219 A | 5/1989 |
| JP | 2000-173979 A | 6/2000 |

OTHER PUBLICATIONS

Taiwan Office action for 097121384 dated Dec. 9, 2011.

* cited by examiner

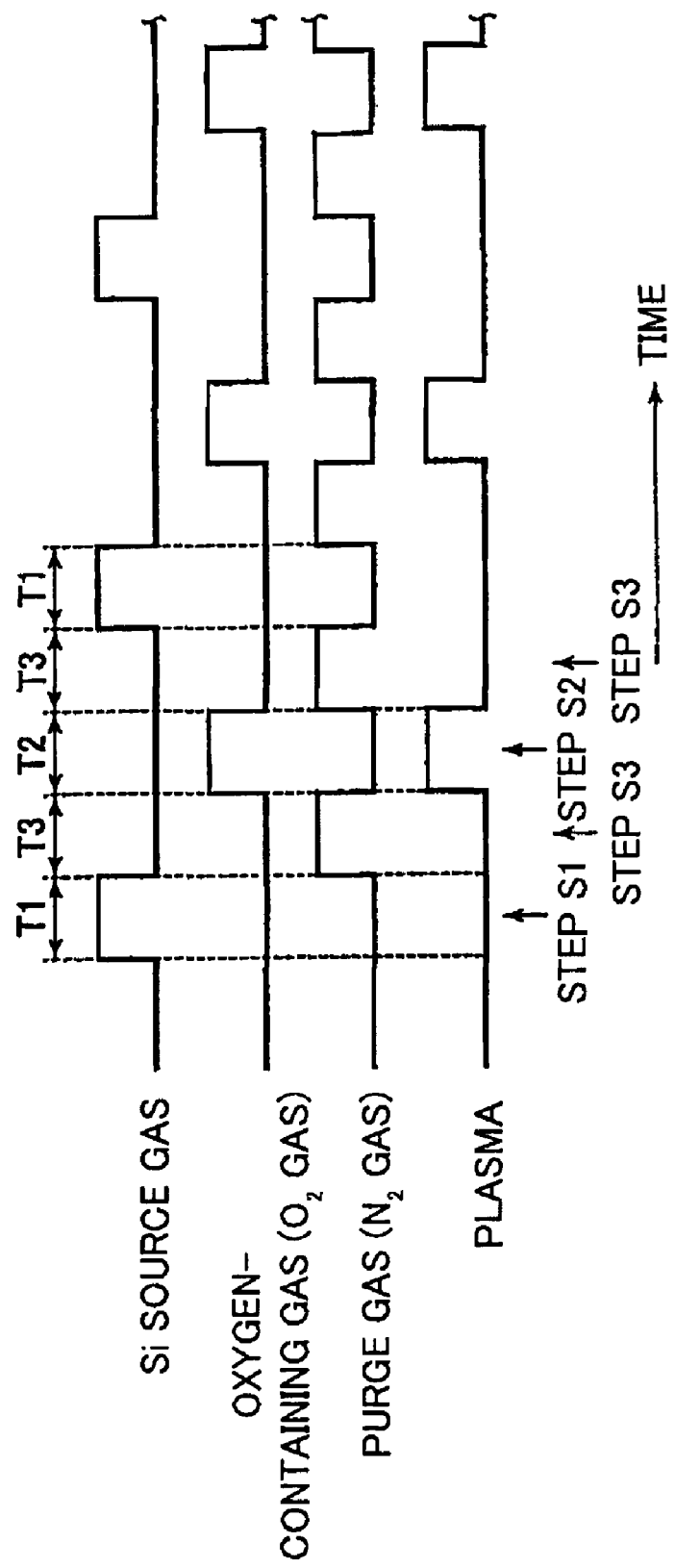

FIG. 11
| IMPURITIES | O₂ GAS PLASMA | O₃ GAS |
|---|---|---|
| C | 1 | 20 |
| N | 1 | 8 |
FIG. 12
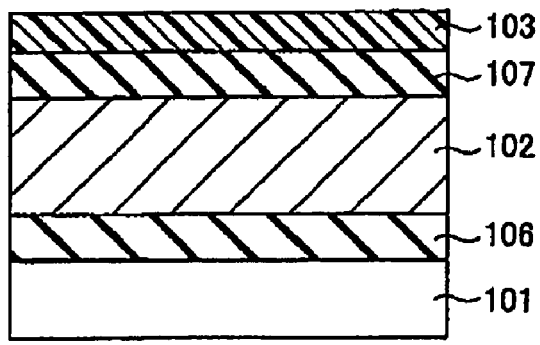
FIG. 13
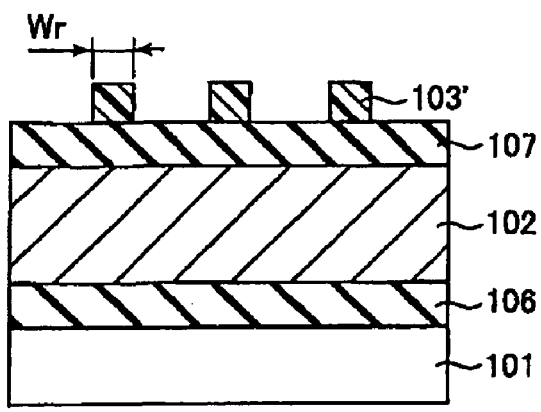

PATTERNING METHOD

TECHNICAL FIELD

The present invention relates to a patterning method for use in a semiconductor manufacturing process, for forming a pattern below or equal to a resolution limit of an exposure apparatus.

BACKGROUND ART

Along with the trend for high integration of a semiconductor device, a wiring width or an isolation width required for a manufacturing process thereof is being reduced. In general, formation of a micro pattern involves forming a resist pattern by using a photolithography technique; and then etching various kinds of underlying thin films by using the resist pattern as an etching mask.

To form the micro pattern, the photolithography technique is important. However, the recent miniaturization of the semiconductor device has progressed to the extent that a dimension no greater than a resolution limit of the photolithography technique is required.

An example technique for forming the pattern no greater than the resolution limit is disclosed in Patent Document 1. The technique of Patent Document 1 basically involves the steps of forming a silicon nitride film (hereinafter, referred to as "sacrificial film") on an underlying film at an interval equivalent to the resolution limit; forming a sidewall silicon oxide film (hereinafter, referred to as "sidewall spacer") on the sidewall of the sacrificial film; removing the sacrificial film while leaving the sidewall spacer; and etching the underlying film by using the remaining sidewall spacer as an etching mask.

According to this technique, since the width of the sidewall spacer can be reduced thinner than that of the sacrificial film, it is possible to form a pattern of the underlying film having a width no greater than the resolution limit by using the sidewall spacer as the etching mask.

Patent Document 1: Japanese Patent Laid-open Publication No. 2000-173979

DISCLOSURE OF THE INVENTION

Problems to be Solved by the Invention

As one method for forming the micro pattern having a width below or equal to the resolution limit of the photolithography technique, there is a micro pattern forming method of using a sacrificial film, as disclosed in Patent Document 1.

However, the sacrificial film for forming the sidewall spacer is formed through the steps of forming a resist film on a plane-shaped sacrificial film, shaping the resist film into a pattern having a preset interval by using the photolithography technique, and performing an etching by using the patterned resist film as an etching mask. Thus, the number of manufacturing steps increases.

In view of the foregoing, the present invention provides a method for forming a micro pattern having a width below or equal to a resolution limit of a photolithography technique through only a small number of manufacturing processes.

Means for Solving the Problems

In order to solve the aforementioned problem, in accordance with a first aspect of the present invention, there is provided a patterning method including: forming a first film on a substrate; forming a multi-layered film including a resist film on the first film; forming a patterned resist film having a preset pattern by patterning the resist film by photolithography; forming a silicon oxide film different from the first film on the patterned resist film and the first film by alternately supplying a first gas containing organic silicon and a second gas containing an oxygen species which is excited into the plasma to the substrate; etching the silicon oxide film to thereby form a sidewall spacer on a sidewall of the patterned resist film; removing the patterned resist film; and processing the first film by using the sidewall spacer as a mask. The multi-layered film, but is not limited thereto, may include, for example, a bottom anti-reflective coating film BARC, a top anti-reflective coating film TARC, a silicon oxide film serving as a underlying film supporting a resist film or the like so as to expose the resist film.

In accordance with a second aspect of the present invention, there is provided a patterning method including: forming a first film on a substrate; forming, on the first film, a second film made of a material different from the first film; forming, on the second film, a hard mask film made of a material different from the second film; forming a resist film on the hard mask film; forming a patterned resist film having a preset pattern by patterning the resist film by photolithography; forming a silicon oxide film different from the hard mask film on the patterned resist film and the hard mask film by alternately supplying a first gas containing organic silicon and a second gas containing an oxygen species which is excited into the plasma to the substrate; etching the silicon oxide film to thereby form a sidewall spacer on a sidewall of the patterned resist film; removing the patterned resist film; processing the hard mask film by using the sidewall spacer as a mask; and processing the second film by using the processed hard mask film as a mask.

Effect of the Invention

In accordance with the present invention, it is possible to provide a method for forming a micro pattern having a width below or equal to a resolution limit through only a small number of manufacturing processes.

BRIEF DESCRIPTION OF THE DRAWINGS

FIG. 9 is a timing chart for describing timing for a gas supply in a film forming method for forming the silicon oxide film 105;

FIG. 11 is a table for comparing the amounts of impurities in respective cases of performing the film formation by using $O_2$ gas plasma and $O_3$ gas plasma;

FIG. 12 provides a cross sectional view to illustrate a major manufacturing process of a patterning method in accordance with a second embodiment of the present invention;

FIG. 13 sets forth a cross sectional view to illustrate a major manufacturing process of the patterning method in accordance with the second embodiment of the present invention;

EXPLANATION OF CODES

Figure 1:
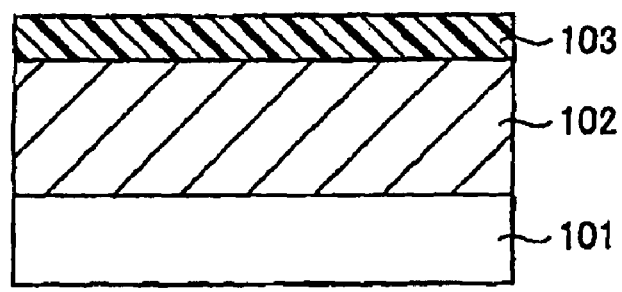
FIG. 1 is a cross sectional view to illustrate a major manufacturing process of a patterning method in accordance with a first embodiment of the present invention.

101: Semiconductor substrate
102: Thin film
103: Photoresist film
103': Resist pattern
105: Silicon oxide film
105': Sidewall spacers
106: Etching stopper film
107: Hard mask film

BEST MODE FOR CARRYING OUT THE INVENTION

Hereinafter, embodiments of the present invention will be described in detail with reference to the accompanying drawings.

First Embodiment

FIGS. 1 to 6 provide cross sectional views to illustrate every major manufacturing process of a patterning method in accordance with a first embodiment of the present invention.

The first embodiment illustrates a basic processing sequence of the patterning method in accordance with the present invention.

First, as shown in FIG. 1, a thin film 102 is formed on a semiconductor substrate 101. In the present specification, the semiconductor substrate 101 does not merely imply a semiconductor substrate, e.g., a silicon substrate, but includes a structure body having, in or on the semiconductor substrate, a semiconductor device, a conductive film corresponding to an integrated circuit pattern and an interlayer insulating film which insulates them. The thin film 102 is processed into a micro pattern later. The thin film 102 may be an insulating film different from a sidewall spacer to be formed later, or may be a conductive film. In the present embodiment, the thin film 102 is, e.g., a conductive polysilicon. Then, photoresist is coated on the thin film 102, so that a photoresist film 103 is formed thereon.

Figure 2:
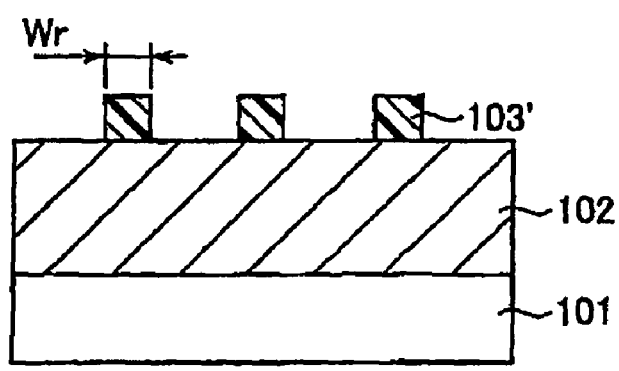
FIG. 2 sets forth a cross sectional view to illustrate a major manufacturing process of the patterning method in accordance with the first embodiment of the present invention.

Subsequently, by using a photolithography technique, the photoresist film 103 is formed into a resist pattern 103' having a preset interval, as shown in FIG. 2. In the present embodiment, the resist pattern 103' has a line-and-space pattern, and the interval of the lines is set to be substantially equivalent to a resolution limit of an exposure apparatus. In the present embodiment, a line width Wr of the resist pattern 103' along a plane direction is set to correspond to the resolution limit, for instance.

Figure 3:
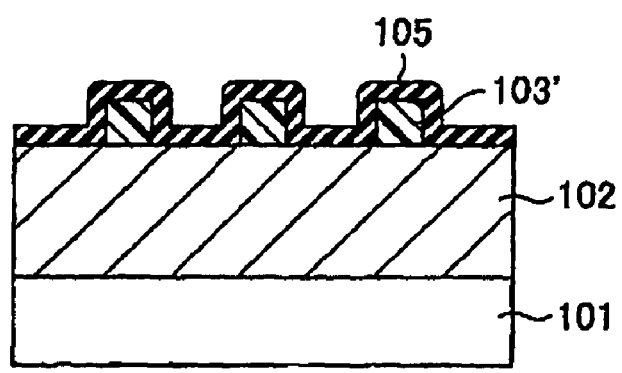
FIG. 3 depicts a cross sectional view to illustrate a major manufacturing process of the patterning method in accordance with the first embodiment of the present invention.

Thereafter, a silicon oxide film 105 different from the resist pattern 103' and the thin film 102 is formed on the resist pattern 103' and the thin film 102, as illustrated in FIG. 3. The silicon oxide film 105 of the present embodiment is formed on the resist pattern 103' and the thin film 102 by alternately supplying a source gas containing organic silicon and a gas containing an oxygen species such as oxygen radicals excited by plasma. To be more specific, by forming the silicon oxide film 105 in an atom layer level or a molecule layer level in sequence while alternately supplying the source gas containing the organic silicon and the gas containing the oxygen species excited by the plasma, the silicon oxide film 105 can be formed at a very low temperature, e.g., a temperature level less than or equal to a heat resistant temperature of the photoresist film 103 (resist pattern 103').

Figure 4:
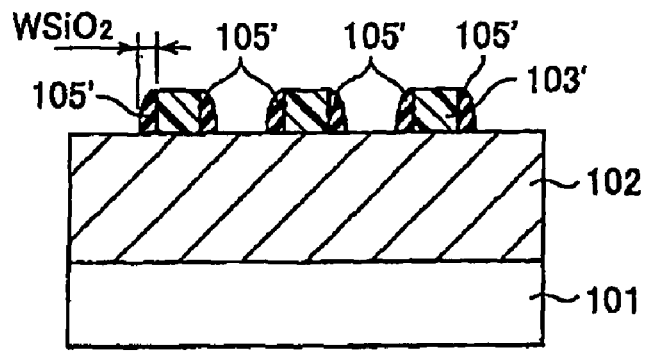
FIG. 4 presents a cross sectional view to illustrate a major manufacturing process of the patterning method in accordance with the first embodiment of the present invention.

Then, as can be seen from FIG. 4, by etching back the silicon oxide film 105 shown in FIG. 3, the silicon oxide film 105 on the resist pattern 103' and the thin film 102 is removed, so that sidewall spacers 105' are formed on sidewalls of the resist pattern 103'. The etch-back is an anisotropic etching, and its example is a RIE method or the like. Since a width $WSiO_2$ of the sidewall spacer 105' along the plane direction can be narrowed smaller than a width Wr of the resist pattern 103', the width $WSiO_2$ can be set to be below or equal to the resolution limit of the exposure apparatus.

Figure 5:
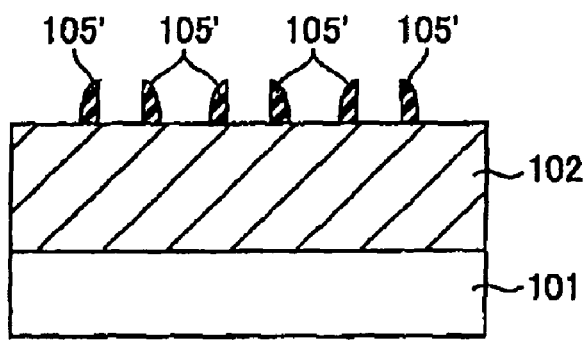
FIG. 5 offers a cross sectional view to illustrate a major manufacturing process of the patterning method in accordance with the first embodiment of the present invention.

Subsequently, as shown in FIG. 5, the resist pattern 103' is removed by using the sidewall spacers 105' and the thin film 102 as a mask. For example, ashing can be employed to remove the resist pattern 103'.

Figure 6:
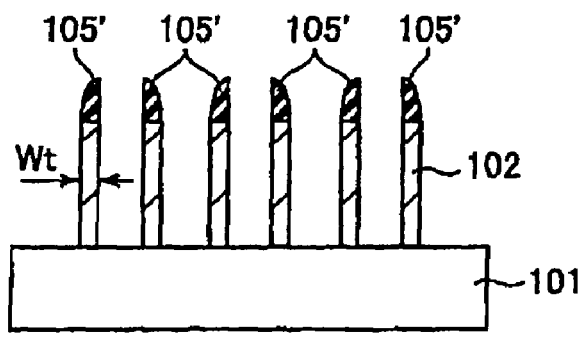
FIG. 6 shows a cross sectional view to illustrate a major manufacturing process of the patterning method in accordance with the first embodiment of the present invention.

Thereafter, as illustrated in FIG. 6, the thin film 102 is etched by using the sidewall spacers 105' as an etching mask, so that the thin film 102 is formed into a pattern having a preset interval. Since a width Wt of the patterned thin film 102 along the plane direction is equal or almost equal to the width $WSiO_2$ of sidewall spacers 105', the width Wt can be set to be below or equal to the resolution limit.

As described above, in accordance with the first embodiment of the present invention, it is possible to form the micro pattern of the thin film 102 having the width Wt below or equal to the resolution limit.

Further, in the first embodiment, the silicon oxide film 105 is formed on the thin film 102 and the resist pattern 103' by alternately supplying the source gas containing the organic silicon and the oxygen species such as the oxygen radicals included in an $O_2$ gas plasma. Accordingly, the silicon oxide film 105 can be formed at the very low temperature, e.g., the temperature level no higher than the heat resistant temperature of the photoresist film 103 (resist pattern 103'). This film formation will be explained in detail as follows.

Figure 7:
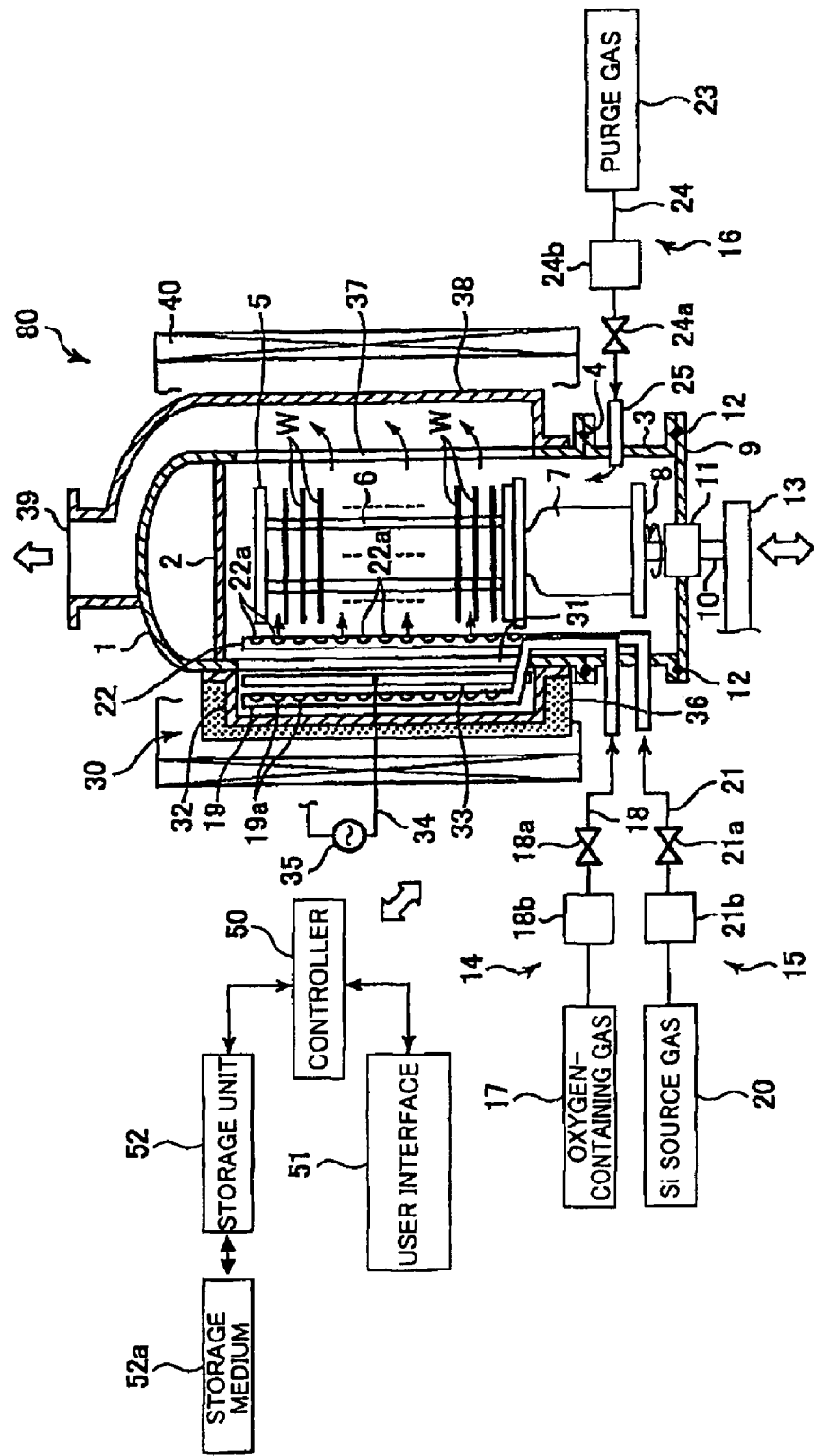
FIG. 7 is a longitudinal cross sectional view of an example of a film forming apparatus for forming a silicon oxide film 105.
Figure 8:
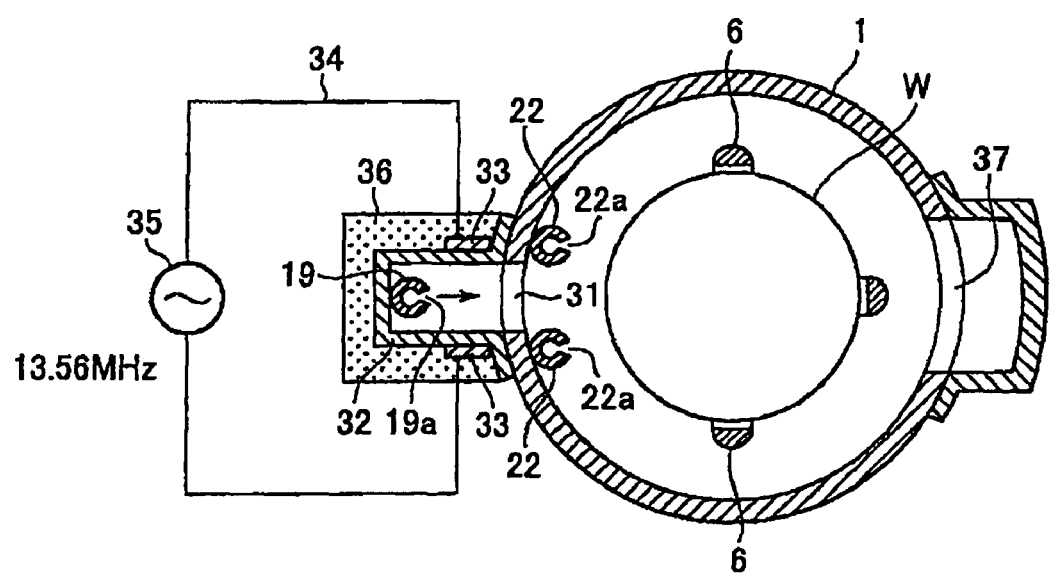
FIG. 8 is a transversal cross sectional view of an example of the film forming apparatus for forming the silicon oxide film 105.

FIG. 7 is a longitudinal cross sectional view illustrating an example of a film forming apparatus used to form the silicon oxide film 105, and FIG. 8 is a transversal cross sectional view of the film forming apparatus of FIG. 7. Further, FIG. 9 is a timing chart for the supply of the gases in the present embodiment. In FIG. 8, illustration of a heating unit is omitted.

As illustrated in FIGS. 7 and 8, a film forming apparatus 80 includes a cylinder shaped processing chamber 1 having a ceiling and an opened bottom. The entire processing chamber 1 is formed of, e.g., quartz, and a ceiling plate 2 made of quartz is installed and sealed airtightly in the ceiling inside the processing chamber 1. Further, a cylinder shaped manifold 3 made of, e.g., stainless steel is connected to the bottom opening portion of the processing chamber 1 through a sealing member 4 such as an O ring.

The manifold 3 supports the bottom of processing chamber 1, and a wafer boat 5, which is made of quartz and capable of accommodating therein a plurality of, e.g., about 50 to 100 sheets of semiconductor wafers W as target objects to be processed in multiple levels, can be inserted into the processing chamber 1 from below the manifold 3. The wafer boat 5 has three supporting columns 6 (see FIG. 8), and the plurality of wafers W are supported by grooves formed on the supporting columns 6.

The wafer boat 5 is mounted on a thermos vessel 7 made of quartz, and the thermos vessel 7 is mounted on a table 8. The table 8 is sustained on a rotational shaft 10 which penetrates a cover unit 9 made of, e.g., stainless steel, for opening and closing a bottom opening portion of the manifold 3.

Further, a magnetic fluid seal 11, for example, is installed at a penetrating portion of the rotational shaft 10 to airtightly seal the rotational shaft 10 while supporting it rotatably. Further, disposed between the peripheral portion of the cover unit 9 and the lower end portion of the manifold 3 is a seal member 12 made of, e.g., an O ring, whereby the inside of the processing chamber 1 is maintained hermetically sealed.

The rotational shaft 10 is mounted on a leading end of an arm 13 supported on an elevation mechanism (not shown) such as a boat elevator. Thus, the wafer boat 5, the cover unit 9 and so forth are elevated to be loaded into the processing chamber 1 and moved down to be unloaded from the processing chamber 1 as one body. Further, it may be possible to fix the table 8 on the side of the cover unit 9 and perform the processing of the wafer W without rotating the wafer boat 5.

Furthermore, the film forming apparatus 80 includes an oxygen-containing gas supply unit 14 for supplying an oxygen-containing gas, e.g., an $O_2$ gas, into the processing chamber 1; a Si source gas supply unit 15 for supplying a Si source gas into the processing chamber 1; and a purge gas supply unit 16 for supplying a nonreactive gas, e.g., a $N_2$ gas into the processing chamber 1 as a purge gas.

In the present embodiment, a Si source gas containing organic silicon is used as the Si source gas for forming the silicon oxide film 105. An example of the Si source gas containing the organic silicon is an aminosilane-based precursor, and an example of the aminosilane-based precursor is a monovalent or divalent aminosilane-based precursor. Specifically, the monovalent or divalent aminosilane-based precursor may be, for example, bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), diisopropylaminosilane (DIPAS), and bisethylmethylaminosilane (BEMAS). Further, one of the above-specified precursors or a combination of two or more of them may be used as the Si source gas containing the organic silicon.

Moreover, as the aminosilane-based precursor, a trivalent aminosilane-based precursor may be also utilized, and an example of the trivalent aminosilane-based precursor is trimethylaminosilane (TDMAS).

Besides the aminosilane-based precursor, an ethoxysilane-based precursor can also be used as the Si source gas containing the organic silicon. The ethoxysilane-based precursor may be, for example, tetraethoxysilane (TEOS).

The oxygen-containing gas supply unit 14 includes an oxygen-containing gas supply source 17; an oxygen-containing gas pipe 18 for introducing an oxygen-containing gas from the oxygen-containing gas supply source 17; and an oxygen-containing gas dispersing nozzle 19 made of a quartz pipe connected with the oxygen-containing gas pipe 18, which is upwardly bent and vertically extended after penetrating the sidewall of the manifold 3 inwardly. A plurality of gas discharge holes 19a is provided at the vertically extended portion of the oxygen-containing gas dispersing nozzle 19 at a preset interval, whereby the oxygen-containing gas, e.g., the $O_2$ gas can be horizontally discharged toward the processing chamber 1 from each gas discharge hole 19a in a substantially uniform manner.

Further, the Si source gas supply unit 15 includes a Si source gas supply source 20; a Si source gas pipe 21 for introducing a Si source gas from the Si source gas supply source 20; and a Si source gas dispersing nozzles 22 made of a quartz pipe connected with the Si source gas pipe 21, which is upwardly bent and vertically extended after penetrating the sidewall of the manifold 3 inwardly. Here, the number of the Si source gas dispersing nozzles 22 is two (see FIG. 8), and each Si source gas dispersing nozzle 22 has a multiplicity of gas discharge holes 22a provided along a lengthwise direction thereof at a predetermined interval. With this configuration, it is possible to discharge the Si source gas containing the organic silicon horizontally toward the processing chamber 1 from each gas discharge hole 22a in a substantially uniform manner. Further, it may be also possible to provide only one Si source gas dispersing nozzle 22.

Further, the purge gas supply unit 16 includes a purge gas supply source 23; a purge gas pipe 24 for introducing a purge gas from the purge gas supply source 23; and a purge gas nozzle 25 connected with the purge gas pipe 24 and penetrating the sidewall of the manifold 3. A non-reactive gas, e.g., a $N_2$ gas can be desirably used as the purge gas.

Opening/closing valves 18a, 21a and 24a and a flow rate controllers 18b, 21b, and 24b such as mass flow controllers are installed on the oxygen-containing gas pipe 18, the Si source gas pipe 21, and the purge gas pipe 24, respectively, so that the oxygen-containing gas, the Si source gas and the purge gas can be supplied while their flow rates are controlled respectively.

A plasma generation unit 30 has a plasma partition wall 32. The plasma partition wall 32 is airtightly installed at an outer wall of the processing chamber 1 to cover a thin and long opening 31 from outside, wherein the opening 31 is formed by scraping off a vertically elongated portion having a preset width in the sidewall of the processing chamber 1. Further, the plasma partition wall 32 has a cross section of a recess shape, and is formed thin and long vertically and is made of, e.g., quartz. In addition, the plasma generation unit 30 includes a pair of thin and long plasma electrodes 33 disposed on the outer surfaces of both sidewalls of the plasma partition wall 32 to face each other along a vertical direction; and a high frequency power supply 35 connected with the plasma electrodes 33 via a power supply line 34 to supply a high frequency power. By applying a high frequency voltage of, e.g., about 13.56 MHz outputted from the high frequency power supply 35 to the plasma electrodes 33, plasma of oxygen-containing gas can be generated. Further, the frequency of the high frequency voltage is not limited to 13.56 MHz, but a frequency of, e.g., about 400 kHz can be used instead.

By forming the plasma partition wall 32 as described above, a part of the sidewall of the processing chamber 1 has the recess shape which is recessed outwardly, and the inner space of the plasma partition wall 32 is allowed to intercommunicate with the inner space of the processing chamber 1 as one body. Further, the opening 31 has a height corresponding to the entire longitudinal direction of a region in which the wafers W are maintained in the wafer boat 5.

While extended upward inside the processing chamber 1, the oxygen-containing gas dispersing nozzle 19 is bent outward along a radial direction of the processing chamber 1 and is uprightly extended along the innermost portion inside the plasma partition wall 32 (i.e., a farthest portion from the center of the processing chamber 1). Accordingly, the oxygen-containing gas discharged from the gas discharge holes 19a is flown into the inner space of the processing chamber 1 after excited into the plasma by a high frequency electric field generated between the electrodes 33 as the high frequency power supply 35 is turned on.

An insulating protection cover 36 made of, e.g., quartz is installed at the outside of the plasma partition wall 32 to enclose it. Further, formed at an inner portion of the insulating protection cover 36 is a non-illustrated coolant path. By flowing, e.g., a cooled nitrogen gas through the coolant path, the plasma electrodes 33 can be cooled.

The two Si source gas dispersing nozzles 22 are uprightly located at both sides of the opening 31 inside the processing chamber 1. An aminosilane gas containing one or two amino groups in a single molecule can be discharged as the Si source gas from the multiplicity of gas discharge holes 22a formed at the Si source gas dispersing nozzles 22 toward the inner space of the processing chamber 1.

Meanwhile, installed at a processing chamber 1's portion opposite to the opening 31 is a gas exhaust opening for vacuum-evacuating the inside of the processing chamber 1. The gas exhaust opening 37 is formed by removing a vertically long part of the sidewall of the processing chamber 1. A gas exhaust opening cover member 38 having a cross section of a recess shape is installed at a processing chamber 1's portion corresponding to the gas exhaust opening 37 by welding to cover the gas exhaust opening 37. The gas exhaust opening cover member 38 is upwardly extended along the sidewall of the processing chamber 1 and forms a gas outlet 39 above the processing chamber 1. The vacuum evacuation is carried out through this gas outlet by a vacuum exhaust unit including a non-illustrated vacuum pump and the like. Further, a cylinder-shaped heating unit 40 for heating the processing chamber 1 and the wafers W therein is installed to surround the outer periphery of the processing chamber 1.

Control of each component of the film forming apparatus 80, for example, a supply/stop of each gas according to opening/closing operations of the values 18a, 21a and 24a, a control of gas flow rates by the mass flow controllers 18b, 21b and 24b, a control of an on/off operation of the high frequency power supply 35, a control of the heating unit 40 and so forth are performed by a controller 50 made up of, e.g., a microprocessor (computer). Connected with the controller 50 is a user interface 51 including, for example, a keyboard with which a process manager performs, e.g., an input of a command to manage the film forming apparatus 80, a display for displaying an operational status of the film forming apparatus 80, and the like.

Furthermore, the controller 50 is connected to a storage unit 52 storing therein control programs to be used in realizing various processes performed by the film forming apparatus 80 under the control of the controller 50, and recipes, i.e., programs to be used in operating each unit of the film forming apparatus 80 according to processing conditions. The control programs or the recipes may be memorized in a storage medium 52a and then stored in the storage unit 52 from the storage medium 52a. The storage medium 52a may be a hard disk or a semiconductor memory, or can also be a portable storage medium such as a CD-ROM, a DVD, a flash memory, or the like. Alternatively, it is also possible to download the control programs or the recipes from another apparatus through, for example, a dedicated line to be stored in the storage unit 52.

Further, a necessary recipe is read from the storage unit 52 in response to an instruction from the user interface 51 or the like and is executed by the controller 50, whereby a desired process is performed in the film forming apparatus 80 under control of the controller 50.

Now, an example of a film forming method of the silicon oxide film 105, which is performed by the film forming apparatus having the above-described configuration, will be explained in conjunction with FIG. 9.

The wafer boat 5 accommodating therein, e.g., 50 to 100 sheets of wafers W is loaded into the processing chamber 1, which has been controlled at a preset temperature in advance by being elevated thereinto from below, and the inner space of the processing chamber 1 is sealed hermetically by closing the bottom opening portion of the manifold 3 with the cover unit 9. Each wafer W has a diameter of, e.g., about 300 mm.

The inside of the processing chamber 1 is maintained at a preset processing pressure, and a wafer temperature is increased to and maintained at a processing temperature by controlling a power supplied to the heating unit 40, and the wafer boat 5 is rotated. In this state, a film forming process is begun.

An example of the film forming process is illustrated in FIG. 9. In the present example, though an aminosilane gas, e.g., BTBAS is used as the Si source gas containing the organic silicon, it is also possible to use another aminosilane gas or an ethoxysilane gas.

As can be seen from FIG. 9, in the present example of the film forming process, a step S1 for adsorbing an Si source by flowing the Si source gas containing the organic silicon into the processing chamber 1, and a step S2 for oxidizing the Si source gas by supplying a gas containing an oxygen species such as oxygen radicals formed by exciting the oxygen-containing gas into the processing chamber 1 are repeated alternately. Furthermore, in the present embodiment, a step S3 for exhausting a residual gas in the processing chamber 1 from the inside of the processing chamber 1 is performed between the steps S1 and S2.

Specifically, in the step S1 in the present example, an aminosilane gas, e.g., the BTBAS, having two amino groups in a single molecule, supplied from the Si source gas supply source 20 of the Si source gas supply unit 15 is discharged as the Si source gas into the processing chamber 1 through the gas discharge holes 22a via the Si source gas pipe 21 and the Si source gas dispersing nozzles 22 for a time period of T1. Accordingly, the Si source is adsorbed on the wafer W. The time period T1 ranges from about 1 to 60 seconds, for example. Further, the flow rate of the Si source gas may be set to be, for example, about 10 to 500 mL/min (sccm), and the internal pressure of the'processing chamber 1 at this time may be set to be, for example, about 13.3 to 665 Pa.

In the step S2 for supplying the gas containing the oxygen species such as the oxygen radicals generated by the plasma, the oxygen-containing gas, e.g., the $O_2$ gas, supplied from the oxygen-containing gas supply source 17 of the oxygen-containing gas supply unit 14 is discharged from the gas discharge holes 19a via the oxygen-containing gas pipe 18 and the oxygen-containing gas dispersing nozzle 19. At this time, by turning on the high frequency power supply 35 of the plasma generation unit 30, the high frequency electric field is generated, so that the oxygen-containing gas, e.g., the $O_2$ gas is excited into the plasma by the high frequency electric field. Then, the thus generated plasma of the oxygen-containing gas is supplied into the processing chamber 1. As a result, the Si source adsorbed in the wafer W is oxidized, so that $SiO_2$ is formed. A processing time T2 for this step ranges from, for example, about 5 to 300 seconds. Further, the flow rate of the oxygen-containing gas, though varied depending on the number of the wafers W sustained on the wafer boat 5, may be set to be about 100 to 20000 mL/min (sccm). Furthermore, the high frequency power supply 35 may be set to have a frequency of about 13.56 MHz and a power of about 5 to 1000 W. The internal pressure of the processing chamber 1 at this time may be set to be about 13.3 to 665 Pa.

In this case, a NO gas, a $N_2O$ gas, a $H_2O$ gas, or an $O_3$ gas can also be used as the oxygen-containing gas, and these gases are used as an oxidizing agent by being excited into the plasma by the high frequency electric field. Though the oxidizing agent is not limited to the plasma of the oxygen-containing gas but can be plasma of other various oxygen-containing gases, the $O_2$ plasma is most desirable. Particularly, by using the oxygen species including the oxygen radicals in the plasma of the $O_2$ gas, the $SiO_2$ film formation can be carried out at a temperature equal to or less than about 300° C. or even 100° C. and ideally even at a room temperature. Further, any one or more than one of the exemplified oxygen-containing gases can be used as the oxygen-containing gas.

Further, the step S3 performed between the steps S1 and S2 is a process for exhausting residual gases in the processing chamber 1 after the steps S1 and S2 to generate a desired reaction in a next step. The step S3 is performed by supplying the non-reactive gas, e.g., the $N_2$ gas, as the purge gas from the purge gas supply source 23 of the purge gas supply unit 16 via the purge gas pipe 24 and the purge gas nozzle 25, while evacuating the processing chamber 1. A processing time T3 for the step S3 ranges from, for example, about 1 to 60 seconds. Further, the flow rate of the purge gas may be set to be, for example, about 50 to 5000 mL/min (sccm). Moreover, the step S3 can be realized by stopping the supply of all the gases and continuing the vacuum evacuation without supplying the purge gas as long as the residual gases in the processing chamber 1 can be exhausted. However, by supplying the purge gas, the residual gases in the processing chamber 1 can be exhausted out for a shorter period of time. Further, the internal pressure of the processing chamber 1 at this time may be set to be about 13.3 to 665 Pa.

In this way, by alternatively and intermittently supplying the Si source gas and the $O_2$ plasma containing the oxygen species such as the oxygen radicals repetitively while performing the step S3 for removing the gases from the processing chamber 1 between the steps S1 and S2, thin layers of the $SiO_2$ film can be repetitively laminated on top of each other till a preset thickness is obtained.

Figure 10A:
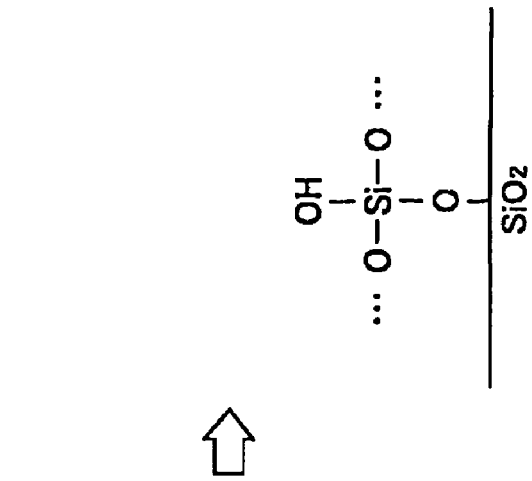
FIGS. 10A to 10C provide schematic diagrams for describing a reaction which takes place when the film forming method of the silicon oxide film 105 is performed.
Figure 10B:
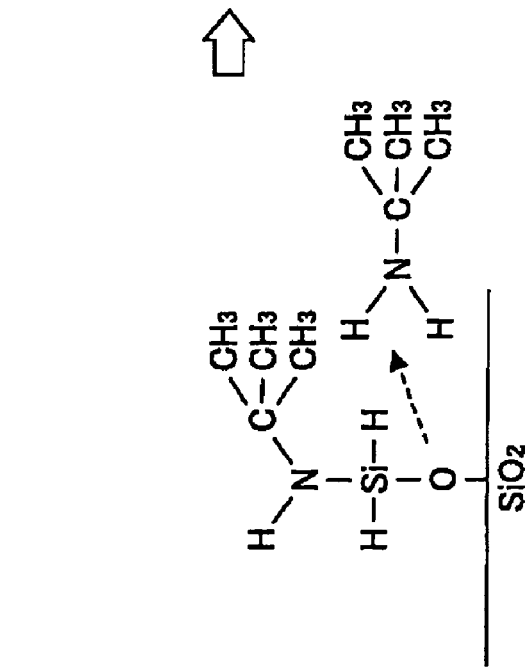
Figure 10C:
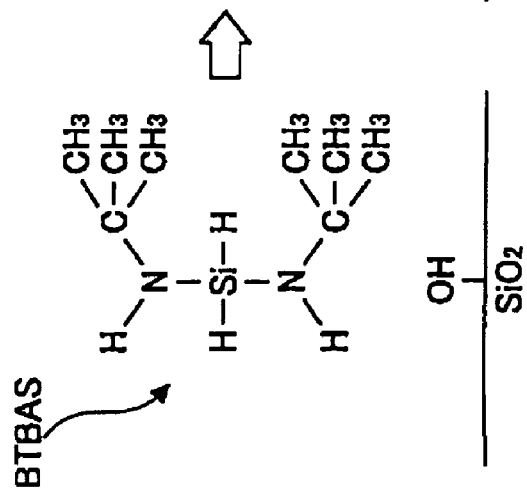

An example of a reaction occurring at this time is illustrated in FIGS. 10A to 10C. FIGS. 10A to 10C schematically show the reaction example. The present reaction example is provided for the case of using the BTBAS as the Si source gas, for instance.

As illustrated in FIG. 10A, an OH group exists on the surface of the previously deposited $SiO_2$ film, and the BTBAS, for example, is supplied thereto as the Si source. In the step (step S1) in which the Si source is adsorbed, a Si of the BTBAS combines with an oxygen atom of the OH group, so that a trimethylamino group is separated, as shown in FIG. 10B. At this time, since the BTBAS, which is aminosilane having two amino groups, has a high reactivity with the OH and the amino groups are unlikely to become a structural obstacle to the reaction between the Si and the OH group, the adsorption reaction of the Si progresses rapidly. The separated trimethylamino group is exhausted from the processing chamber 1 through the step S3. Then, in a next oxidizing step (step S2), a Si compound left after the separation of the trimethylamino group is oxidized by the oxygen species including the oxygen radicals in the $O_2$ gas plasma, and thus becomes $SiO_2$ (on the surface thereof, however, H is adsorbed, so that an OH group is formed). As described, unlike a genuine chemical reaction, the oxidation reaction using the oxygen species including the oxygen radicals in the $O_2$ gas plasma does not requires a high temperature, so that the reaction can take place at a low temperature.

The BTBAS is an aminosilane gas having the two amino groups in a single molecule, and is used as the Si source gas. Besides the BTBAS, BDEAS (bisdiethylaminosilane) and BDMAS (bisdimethylaminosilane) can also be used as such aminosilane gas.

Further, as the Si source gas, it may be also possible to use an aminosilane gas having three or more amino groups in a single molecule, or an aminosilane gas having a single amino group in a single molecule.

In accordance with the first embodiment, since the source gas containing the organic silicon, which is used as the Si source, and the oxygen species including the oxygen radicals contained in the $O_2$ gas plasma, with which the reaction in the oxidizing process can progress without having to increase the temperature, are alternately supplied, it is possible to form the $SiO_2$ film featuring a fine film quality at about 100° C. or below, or even at a conventionally un-attempted low temperature such as a room temperature with a high film forming rate.

As described, in accordance with the present embodiment, though the film formation can be carried out at a very low temperature equal to or less than about 100° C. in principle, it is also possible to perform the film formation at a higher temperature than that. However, when considering the fact that the non-uniformity of film thickness increases with an increase of the film forming temperature along with the consideration of a thermal influence upon the resist pattern 103', it is most desirable to set the film forming temperature to be not greater than about 100° C.

Now, results of actually performing a film formation based on the first embodiment will be explained.

First, an experiment upon an oxidizing agent was carried out. A $SiO_2$ film was formed by alternately supplying BTBAS, which is used as a Si source gas, and an $O_2$ gas plasma, which is used for an oxidizing process. Here, the step S1 was performed for 30 seconds by loading 100 sheets of 300 mm wafers into the processing chamber and setting a film forming temperature, a supply amount of the BTBAS and a pressure to be 100° C., 30 mL/min (sccm) and 53 Pa, respectively. Then, the step S2 was performed for 40 seconds by setting a supply amount of an $O_2$ gas and the pressure to be 2000 mL/min (sccm) and 665 Pa, respectively, while supplying a high frequency power of a frequency of 13.56 MHz at a power of 50 W. By performing 42 cycles of the steps 1 and 2, the $SiO_2$ film was formed. Further, to purge the inside of the processing chamber, a $N_2$ gas was supplied as a purge gas at a flow rate of 3500 mL/min (scorn) for 7 seconds before the step S1 and for 6 seconds before the step S2, respectively, while vacuum-evacuating the processing chamber.

For comparison, a $SiO_2$ film was formed under the same conditions as described above excepting that an $O_3$ gas, without being excited into plasma, was supplied at a flow rate of 250 g/Nm$^3$ as the oxidizing agent for the oxidizing process in the step S2.

As a result, based on the present embodiment, it was found that when using the oxygen species including the oxygen radicals in the $O_2$ gas plasma as the oxidizing agent, a film forming rate (speed) five times as high as that in case of using the $O_3$ gas without radicalizing oxygen can be obtained. Further, it was also found that non-uniformity in film thicknesses within a surface is very small when using the $O_2$ gas plasma.

Then, an experiment upon a film forming temperature was conducted.

Here, BTBAS was used as the Si source gas, and an $O_2$ gas plasma was used for the oxidizing process, and a film formation was performed under the same conditions as described in the above experiment except the film forming temperature. The experiment was performed by varying the temperature from a room temperature (25° C.) to 75° C., 100° C., 200° C. and 300° C.

As a result, it was found that the film formation can be achieved at a low temperature no greater than 100° C. with a high film forming rate, and a sufficiently practical film formation can be realized even at the room temperature. Moreover, it was also found that a high-uniformity film thickness can be obtained with a high film forming rate in a low temperature range below 100° C., especially, in a temperature range from 25° C. (room temperature) to 75° C. Further, it was also found that a temperature level no greater than 300° C. is desirable as the film forming temperature because non-uniformity of the film thickness increases if the film forming temperature exceeds 300° C. In particular, when performing the film formation on a resist pattern, it is desirable to set the temperature to be not greater than 100° C., as described earlier.

Then, the concentration of impurities during a hardening process was measured.

Here, concentrations of carbon (C) and nitrogen (N), which are used as impurities, in the case of performing a film formation by using an $O_2$ gas plasma for the oxidizing process were compared with those in the case of performing the film formation by using an $O_3$ gas, wherein BTBAS was employed as the Si source gas in both cases. The measurement was carried out by employing a secondary ion mass spectrometry (SIMS).

The result is provided in FIG. 11. As can be seen from this figure, if the concentration of C and the concentration of N in the case of forming a $SiO_2$ film by using the $O_2$ gas plasma are respectively standardized as "1", the concentration of carbon (C) and the concentration of nitrogen (N) were found to be 20 times and 8 times greater in case that the film formation was carried out by using the $O_3$ gas. As found from this result, it is effective to perform the film formation by using the $O_2$ gas plasma during the formation of the silicon oxide film 105 in the aspect of removing the impurities. In general, a photoresist film is vulnerable to ammonia, and generation of ammonia is one of the causes for the occurrence of photoresist poisoning. To suppress the generation of ammonia, it is effective to suppress the generation of nitrogen (N). If the oxidizing process is performed by using the $O_2$ gas plasma, the generation amount of nitrogen (N) can be reduced, so that it becomes possible to suppress the photoresist poisoning. This is advantageous when applied to the formation of the silicon oxide film 105 for coating the resist pattern 103'.

The silicon oxide film 105 shown in FIG. 3 can be formed by the above-described film forming apparatus 80 according to the above-stated film forming method at a very low temperature no greater than a heat resistant temperature of the photoresist film 103 (resist pattern 103') with a high controllability of film thickness. Accordingly, it is possible to use the resist pattern 103' as a base body (sacrificial film) for forming the sidewall spacers 105'. In comparison with the micro pattern forming method disclosed in, e.g., Patent Document 1, the process of patterning the sacrificial film (silicon nitride film) can be omitted by using the resist pattern 103' as the sacrificial film. Accordingly, the first embodiment has an advantage in that a micro pattern having a width below or equal to a resolution limit can be fabricated through a smaller number of processing steps.

The micro pattern of the thin film 102 thus obtained can be used as an integrated circuit pattern of a high density, such as a gate electrode of a transistor, a bit-line of a semiconductor memory, or the like. In other words, the above-stated film forming method can be desirably applied to the formation of the gate electrode or the bit-line in the manufacturing process of the integrated circuit.

Second Embodiment

FIGS. 12 to 18 provide cross sectional views to describe every major manufacturing process of a patterning method in accordance with a second embodiment of the present invention.

The second embodiment illustrates an example of the patterning method in accordance with the present invention, which can be more desirably applied to an actual semiconductor manufacturing process.

First, as shown in FIG. 12, an etching stopper film 106 is formed on a semiconductor substrate 101. The etching stopper film 106 functions to stop etching when a thin film to be formed on top of it is etched. In the present embodiment, the etching stopper film 106 is, e.g., a silicon nitride film. Subsequently, a thin film 102 formed of a different material from the etching stopper film 106 is formed on the etching stopper film 106. In the present embodiment, the thin film 102 is, e.g., a conductive polysilicon film, as in the first embodiment. Subsequently, a hard mask film 107 made of a different material from the thin film 102 is formed on the thin film 102. The hard mask film 107 serves as an etching mask when etching the thin film 102. In the present embodiment, the hard mask film 107 is, e.g., a silicon nitride film. Thereafter, photoresist is coated on the hard mask film 107, so that a photoresist film 103 is formed thereon.

Subsequently, by using a photolithography technique, the photoresist film 103 is formed into a resist pattern 103' having a preset interval, as shown in FIG. 13. In the present embodiment, the resist pattern 103' has a line-and-space pattern, and the interval of the lines is set to be substantially equivalent to a resolution limit of an exposure apparatus, as in the first embodiment. In the present embodiment, a width Wr of the resist pattern 103' along a plane direction is set to correspond to the resolution limit.

Figure 14:
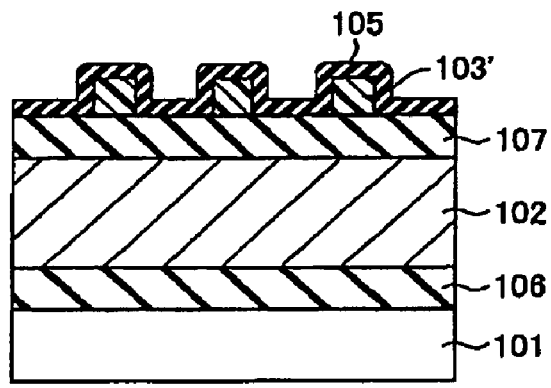
FIG. 14 depicts a cross sectional view to illustrate a major manufacturing process of the patterning method in accordance with the second embodiment of the present invention.

Thereafter, a silicon oxide film 105 different from the resist pattern 103' and the hard mask film 107 is formed on the resist pattern 103' and the hard mask film 107, as illustrated in FIG. 14. In the present embodiment, the silicon oxide film 105 is formed by alternately supplying a source gas containing organic silicon and a gas containing an oxygen species such as oxygen radicals excited by plasma, as in the first embodiment. Accordingly, the silicon oxide film 105 can be formed at a very low temperature, e.g., a temperature level less than or equal to a heat resistant temperature of the photoresist film 103 (resist pattern 103').

Figure 15:
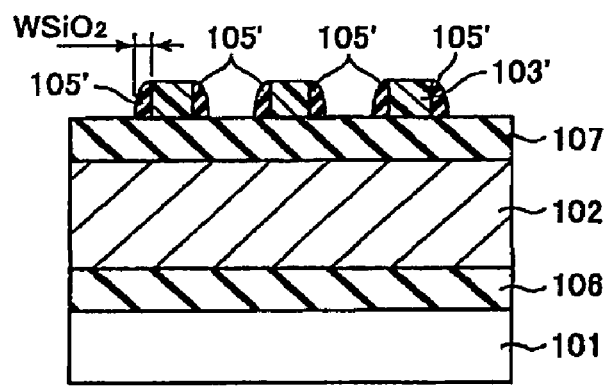
FIG. 15 presents a cross sectional view to illustrate a major manufacturing process of the patterning method in accordance with the second embodiment of the present invention.

Then, as can be seen from FIG. 15, by etching back the silicon oxide film 105 shown in FIG. 14, the silicon oxide film 105 on the resist pattern 103' and the hard mask film 107 is removed, so that sidewall spacers 105' are formed on sidewalls of the resist pattern 103'. The etch-back is an anisotropic etching, and its example is a RIE method or the like. Since a width $WSiO_2$ of the sidewall spacer 105' along the plane direction can be narrowed smaller than a width Wr of the resist pattern 103', the width $WSiO_2$ can be set to be not greater than the resolution limit of the exposure apparatus.

Figure 16:
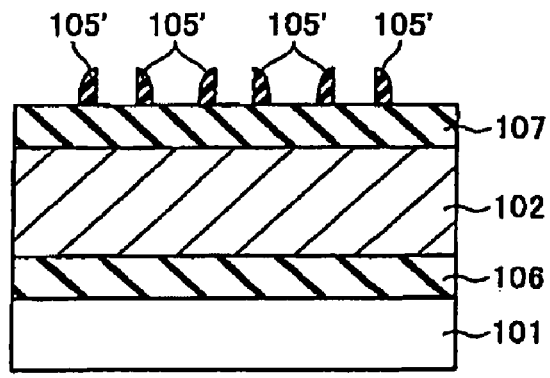
FIG. 16 offers a cross sectional view to illustrate a major manufacturing process of the patterning method in accordance with the second embodiment of the present invention.

Then, as shown in FIG. 16, the resist pattern 103' is removed by using the sidewall spacers 105' and the hard mask film 107 as a mask. The resist pattern 103' can be removed by, for example, ashing.

Figure 17:
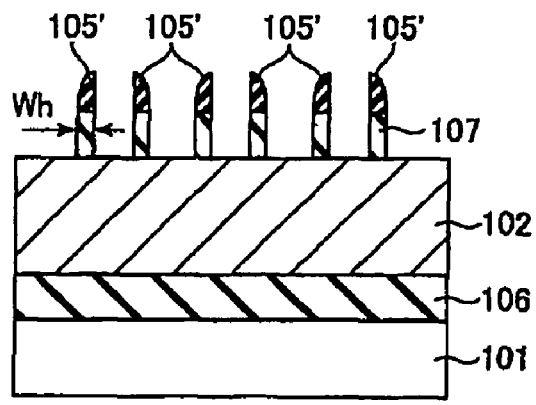
FIG. 17 shows a cross sectional view to illustrate a major manufacturing process of the patterning method in accordance with the second embodiment of the present invention.

Thereafter, as illustrated in FIG. 17, the hard mask film 107 is etched by using the sidewall spacers 105' as a mask to be formed into a pattern having the preset interval. Since a width Wh of the patterned hard mask film 107 along the plane direction is equal or almost equal to a width $WSiO_2$ of the sidewall spacer 105', the width Wh can be set to be below or equal to the resolution limit.

Figure 18:
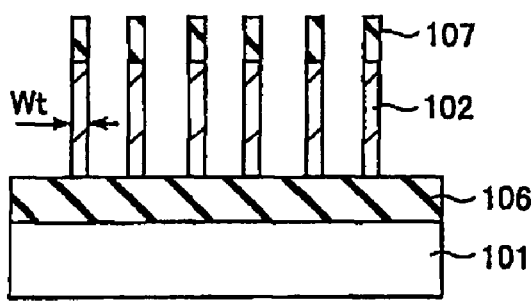
FIG. 18 presents a cross sectional view to illustrate a major manufacturing process of the patterning method in accordance with the second embodiment of the present invention.

Subsequently, as shown in FIG. 18, the thin film 102 is formed into a pattern having the preset interval by using the hard mask film 107 as a mask after removing the sidewall spacers 105', for example. Since the width Wt of the patterned thin film 102 along the plane direction is equal or almost equal to the width Wh, the width Wt can be set to be not greater than the resolution limit.

As described above, in accordance with the second embodiment of the present invention, it is possible to form the micro pattern of the thin film 102 having the width Wt below or equal to the resolution limit.

In the second embodiment, the silicon oxide film 105 is formed by alternately supplying the source gas containing the organic silicon and the gas containing the oxygen species such as the oxygen radicals excited by the plasma, as in the first embodiment. Thus, it is possible to use the resist pattern 103' as a base body (sacrificial film) for forming the sidewall spacers 105'. In comparison with the micro pattern forming method disclosed in, e.g., Patent Document 1, the process of patterning the sacrificial film (silicon nitride film) can be omitted by using the resist pattern 103' as the sacrificial film. Accordingly, there is an advantage in that a micro pattern having a width below or equal to a resolution limit can be fabricated through a smaller number of processing steps.

Furthermore, in the second embodiment, the etching stopper film 106 is formed under the thin film 102, and the hard mask film 107 is formed on the thin film 102. Thus, in comparison with, e.g., the case of processing the thin film 102 by etching the thin film 102 by using the sidewall spacers 105' as a mask, it is possible to process the thin film 102 having a thickish film thickness. In addition, since the etching of the thin film 102 is stopped at the etching stopper film 106, excessive etching under the thin film 102 can be prevented even in case the thin film 102 having the thickish film thickness is etched. From these advantages, in accordance with the second embodiment of the present invention, a pattern of the thin film 102 having, e.g., a high aspect ratio (height/width) can be formed. The pattern of the thin film 102 having the high aspect ratio has a large cross section though its area is small, when seen from a plane view. Therefore, resistance can be reduced, and it has advantages when applied to a wiring pattern, e.g., a bit-line pattern of a semiconductor memory, or the like.

Further, by using a gate insulating film such as a thermal oxide film as a first thin film and using polysilicon or the like to be formed as a gate electrode as a second thin film, it becomes possible to fabricate a miniaturized gate structure.

Third Embodiment

FIGS. 19 to 24 present cross sectional views to illustrate every major manufacturing process of a patterning method in accordance with a third embodiment of the present invention.

The third embodiment provides an example of trimming a resist pattern 103'. By trimming the resist pattern 103', finer micro patterns made of a thin film 102 can be formed.

Figure 19:
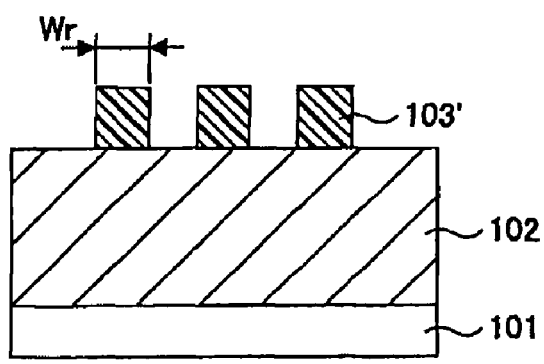
FIG. 19 provides a cross sectional view to illustrate a major manufacturing process of a patterning method in accordance with a third embodiment of the present invention.

First, as shown in FIG. 19, the resist pattern 103' is formed on the thin film 102 according to the method described with reference to FIGS. 1 and 2. In the present embodiment, a width Wr of the resist pattern 103' in the plane direction is set to be approximately equal to a resolution limit.

Figure 20:
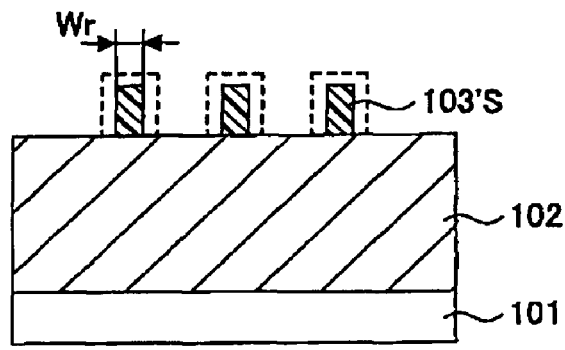
FIG. 20 sets forth a cross sectional view to illustrate a major manufacturing process of the patterning method in accordance with the third embodiment of the present invention.

Subsequently, as illustrated in FIG. 20, the resist pattern 103' is trimmed, so that a trimmed resist pattern 103'S is obtained (referred to as "trimming process" in the present specification). The trimming process is performed at a temperature ranging from a room temperature to about 100° C. under the atmosphere containing oxygen radicals or an ozone gas. By trimming the resist pattern 103', the width Wr of the trimmed resist pattern 130'S in the plane direction is narrowed to be below or equal to the resolution limit.

Figure 21:
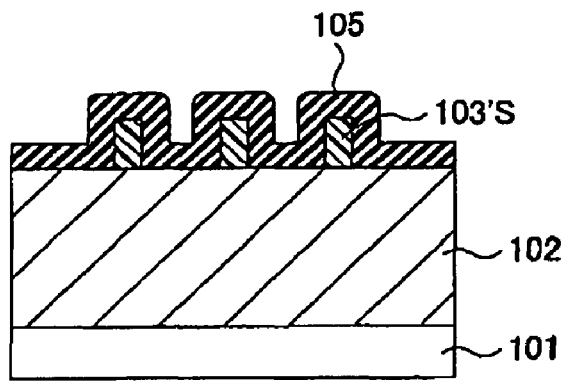
FIG. 21 depicts a cross sectional view to illustrate a major manufacturing process of the patterning method in accordance with the third embodiment of the present invention.

Next, as shown in FIG. 21, by alternately supplying a source gas containing organic silicon and a gas containing an oxygen species including oxygen radicals excited by plasma, a silicon oxide film 105 is formed on the trimmed resist pattern 103'S and the thin film 102, as in the first embodiment. Thus, the silicon oxide film 105 can be formed at a temperature no greater than a heat resistant temperature of, e.g., a photoresist film 103 (resist pattern 103') and the trimmed resist pattern 103'S.

Figure 22:
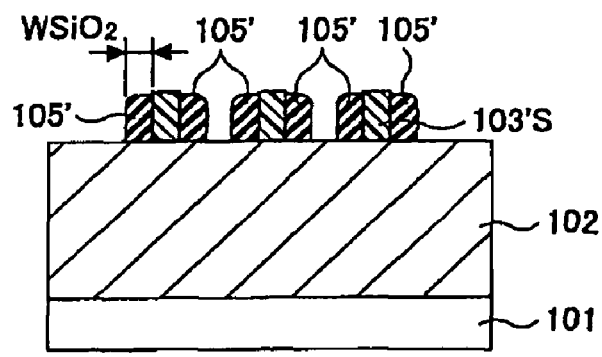
FIG. 22 presents a cross sectional view to illustrate a major manufacturing process of the patterning method in accordance with the third embodiment of the present invention.

Subsequently, as illustrated in FIG. 22, the silicon oxide film 105 shown in FIG. 21 is etched back anisotropically by, for example, a RIE method. Then, by removing the silicon oxide film 105 on the trimmed resist pattern 103'S and the thin film 102, sidewall spacers 105' are formed at sidewalls of the trimmed resist pattern 103'S. A width $WSiO_2$ of the sidewall spacer 105' along a plane direction is narrowed smaller than a width Wr of the trimmed resist pattern 103'S, and can be set to be not greater than the resolution limit of an exposure apparatus.

Figure 23:
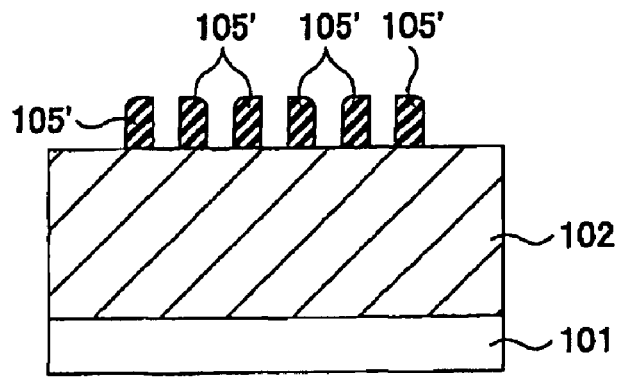
FIG. 23 offers a cross sectional view to illustrate a major manufacturing process of the patterning method in accordance with the third embodiment of the present invention.

Thereafter, as shown in FIG. 23, the trimmed resist pattern 103'S is removed by using the sidewall spacers 105' and the thin film 102 as a mask. The trimmed resist pattern 103'S can be removed by, for example, ashing.

Figure 24:
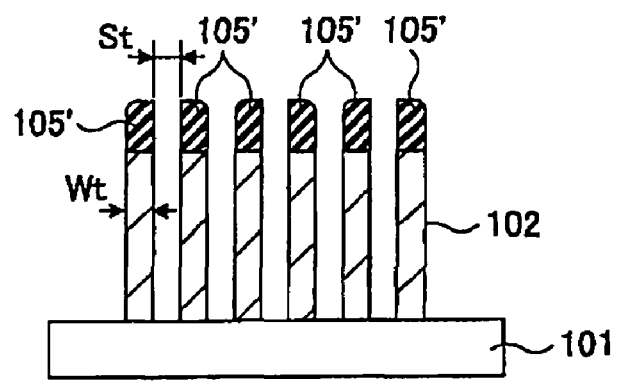
FIG. 24 shows a cross sectional view to illustrate a major manufacturing process of the patterning method in accordance with the third embodiment of the present invention.

Thereafter, as illustrated in FIG. 24, the thin film 102 is etched by using the sidewall spacers 105' as an etching mask, so that the thin film 102 is formed into a pattern having the preset interval. Since a width Wt of the patterned thin film 102 along the plane direction is equal or almost equal to the width $WSiO_2$ of the sidewall spacer 105', the width Wt can be set to be below or equal to the resolution limit.

Further, in accordance with the third embodiment, since the resist pattern 103' is shrinked, a space width St between the sidewall spacers 105' can be set to be not greater than the resolution limit, either.

As described above, in accordance with the third embodiment, micro patterns of the thin film 102 having the width Wt and the space width St no greater than the resolution limit can be formed.

Moreover, as illustrated in FIG. 24, though the line width Wt and the space width St are identical, they can be realized by appropriately designing a line-and-space pattern of the photoresist film 103. However, it is apparent that the line-and-space pattern of the photoresist film 103 can be desirably designed such that the line width Wt and the space width St of the etched thin film 102 are different.

In the third embodiment, as in the first embodiment, the silicon oxide film 105 is formed by alternately supplying the source gas containing the organic silicon and the gas containing the oxygen species such as the oxygen radicals excited by the plasma, as in the first embodiment. Thus, it is possible to use the resist pattern 103' as a base body (sacrificial film) for forming the sidewall spacers 105'. The process of patterning the sacrificial film (silicon nitride film) in the aforementioned Patent Document 1 can be omitted by using the resist pattern 103' as the sacrificial film. Accordingly, there is an advantage in that a micro pattern having a width below or equal to a resolution limit can be fabricated through a smaller number of manufacturing processes.

Moreover, the third embodiment can be combined with the second embodiment. In such case, the trimming process described with reference to FIG. 20 is performed between the processing step described in FIG. 13 and the processing step described in FIG. 14. This combination allows achieving all the advantages of the second and third embodiments.

Further, it should be noted that the present invention is not limited to the above-described embodiments, but can be modified in various ways. For example, though the above embodiments have been described for the case of applying the present invention to a batch type film forming apparatus which performs a film formation on a plurality of wafers accommodated therein at one time, the present invention can also be applied to a single-wafer type film forming apparatus which performs a film formation on each sheet of a wafer. Further, the ethoxysilane gas and the aminosilane gas are not limited to the examples mentioned in the above embodiments. Further, though the oxidizing agent is exemplified by, e.g., the oxygen radicals generated as a result of exciting various oxygen-containing gases into plasma, any gases can be used without being limited to this example as long as they can generate oxygen species such as the oxygen radicals. Further, the aforementioned oxygen species can also be generated by activating oxygen molecules and the like as a result of irradiating laser beams or ultraviolet backlight (having a wavelength less than or equal to about 350 mm) to various oxygen-containing gases, not by the plasma. Furthermore, they can be generated by thermally activating the oxygen-containing gases.

Moreover, in the above-described embodiments, though the Si source gas and the gas containing the oxygen species excited by the plasma are supplied in the completely alternate manner, it is also possible to supply the gas containing the oxygen species activated (excited) by the plasma or the like when supplying the Si source gas.

Figure 25A:
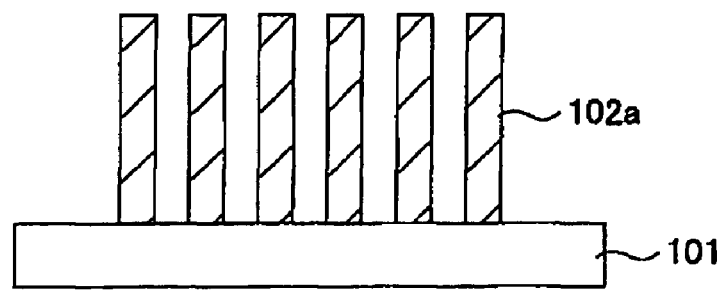
FIG. 25A provides a cross sectional view to describe a semiconductor device manufacturing method capable of being performed subsequently to the patterning methods in accordance with the first to the third embodiments.
Figure 25B:
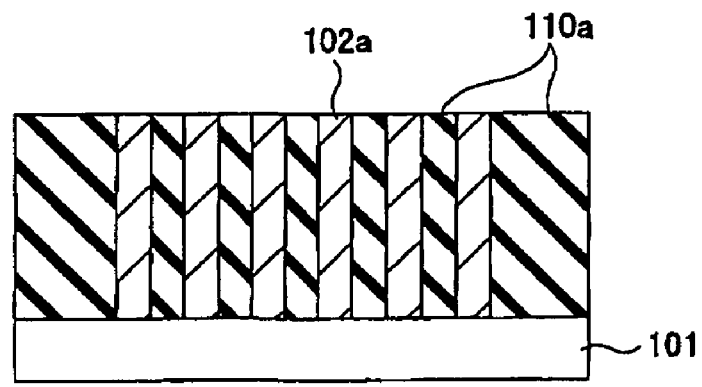
FIG. 25B presents a cross sectional view to describe a semiconductor device manufacturing method capable of being performed subsequently to the patterning methods in accordance with the first to the third embodiments.

In addition, the patterning methods described in the above embodiments can be developed into a method for manufacturing a semiconductor device by continuing the following process. That is, if there is performed a step for removing the sidewall spacers 105' used as the etching mask after performing a step for obtaining the micro pattern by etching the thin film 102 (see FIGS. 6 and 24) in case that the thin film 102 as the target of the etching is made of an insulating material such as silicon nitride or the like, the micro pattern (hereinafter, referred to as "insulating film 102a" for the convenience of explanation) is left on the semiconductor substrate 101, as shown in FIG. 25A. Subsequently, if there are performed a step for filling gaps of the insulating film 102a with a semiconductor, e.g., silicon and a step for exposing the top surface of the insulating film 102a by planarizing the buried semiconductor, the insulating film 102a and silicon portions 110a are arranged alternately, as illustrated in FIG. 25B. Thus, it is possible to manufacture a semiconductor device in which the silicon portions 110a serve as a device region, while the insulating film 102a functions as a device isolation region. Furthermore, it may be also possible to perform a conduction control (control of a conduction type and/or conductivity) by adding certain impurities into the semiconductor when filling the gaps of the insulating film 102a. Moreover, it may be also possible to perform a step of burying a semiconductor instead of the step of removing the sidewall spacers 105', because the sidewall spacers 105' can be still removed in the planarizing step. However, removing the sidewall spacers 105' in advance is more desirable because it allows a reduction of an aspect ratio when burying the gaps of the insulating film 102a with the semiconductor.

Figure 26A:
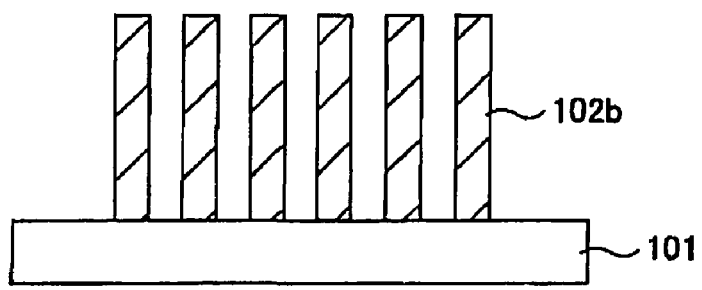
FIG. 26A depicts a cross sectional view to describe a semiconductor device manufacturing method capable of being performed subsequently to the patterning methods in accordance with the first to the third embodiments.
Figure 26B:
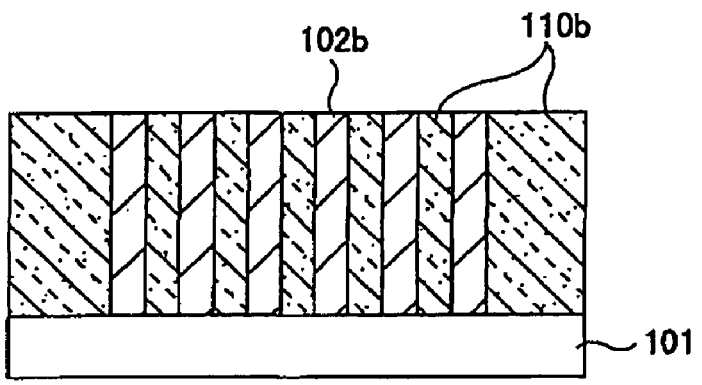
FIG. 26B sets forth a cross sectional view to describe a semiconductor device manufacturing method capable of being performed subsequently to the patterning methods in accordance with the first to the third embodiments.

Furthermore, if there is performed a step for removing the sidewall spacers 105' used as the etching mask after performing a step for obtaining the micro pattern by etching the thin film 120 (see FIGS. 6 and 24) in case that the thin film 102 as the target of the etching is formed of a semiconductor, e.g., silicon, the micro pattern (hereinafter, referred to as "silicon film 102b" for the convenience of explanation) is left on the semiconductor substrate 101. Subsequently, if there are performed a step for filling gaps of the silicon film 102b with an insulating material such as silicon oxide, silicon oxynitride, silicon nitride or the like and a step for exposing the top surface of the silicon film 102b by planarizing the buried insulating material, the silicon film 102b and insulting portions 110b are arranged alternately, as illustrated in FIG. 26B. Thus, it is possible to manufacture a semiconductor device in which the silicon film 102b serves as a device region, while the insulating portions 110b function as a device isolation region. Furthermore, in case that the thin film 102 is made of the semiconductor, it may be also possible to perform a conduction control (control of a conduction type and/or conductivity) by previously adding certain impurities into the thin film 102 by ion implantation. Moreover, it may be also possible to perform a step of burying an insulating material instead of the step of removing the sidewall spacers 105', because the sidewall spacers 105' can be still removed in the planarizing step. However, removing the sidewall spacers 105' in advance is more desirable because it allows a reduction of an aspect ratio when burying the gaps of the silicon film 102b with the insulating material.

Figure 27:
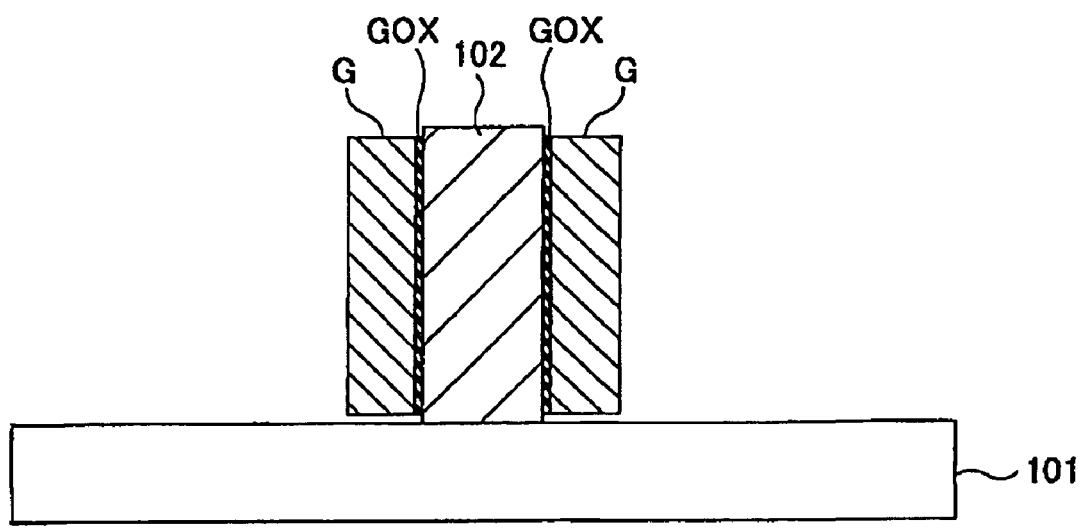
FIG. 27 is a cross sectional view showing an example of a semiconductor device, which can be manufactured by using the patterning methods in accordance with the first to the third embodiments.

Moreover, the patterning methods in accordance with the first to the third embodiments can be employed for the manufacture of a semiconductor device shown in FIG. 27. FIG. 27 is a cross sectional view of a so-called Fin type field effect transistor (FET) including a thin film 102 formed by any one of the patterning methods in accordance with the first to the third embodiments; insulating layers GOX formed to interpose the thin film 102 therebetween; and electrode layers G in contact with the insulating layers GOX. Since the thin film 102 having a narrower width than the resolution limit of an exposure apparatus for use in a photolithography process can be formed by the patterning methods in accordance with the embodiments of the present invention, the Fin type FET can be miniaturized, and integration density can be improved.

In addition, though the embodiments have been described for the case of assembling the plasma generation unit to the processing chamber as one body, the present invention is not limited thereto. That is, a remote plasma apparatus installed separately from the processing chamber and introducing previously generated plasma from the outside of the processing chamber therein can be used instead.

Furthermore, though the wafer boat 5 of the film forming apparatus 80 (80') has been described to be able to accommodate 50 to 100 sheets of wafers W, the number of the wafer W mounted therein is not limited to this range. For example, the film forming apparatus 80 (80') may have the wafer boat 5 capable of accommodating a relatively small number of, e.g., 2 to 15 sheets of wafers. Besides, the film forming apparatus 80 (80') may be configured as a semi-batch (mini-batch) type film forming apparatus designed to process the relatively small number of, e.g., 2 to 15 sheets of wafers.

In addition, the target object to be processed is not limited to the semiconductor wafer, but the present invention can be applied to other types of substrates, such as a LCD glass substrate and the like.

The present international application claims the benefit of Japanese Patent Application Ser. No. 2007-153185, filed on Jun. 8, 2007, of which specification, claims and drawings are hereby incorporated by reference in its entirety.

What is claimed is:

1. A patterning method comprising:
   forming a first film on a substrate;
   forming a multi-layered film including a photoresist film on the first film;
   forming a patterned photoresist film serving as a sacrificial film for forming a sidewall spacer and having a preset pattern by processing the photoresist film by photolithography;
   forming a silicon oxide film different from the first film on the patterned photoresist film and the first film by alternately supplying a first gas containing organic silicon and a second gas containing an activated oxygen species to the substrate;
   etching the silicon oxide film to thereby form the sidewall spacer on a sidewall of the patterned photoresist film;
   removing the patterned photoresist film; and
   processing the first film by using the sidewall spacer as a mask.

2. A patterning method comprising:
   forming a first film on a substrate;
   forming, on the first film, a second film made of a material different from the first film;
   forming, on the second film, a hard mask film made of a material different from the second film;
   forming a photoresist film on the hard mask film;
   forming a patterned photoresist film serving as a sacrificial film for forming a sidewall spacer and having a preset pattern by processing the photoresist film by photolithography;
   forming a silicon oxide film different from the hard mask film on the patterned photoresist film and the hard mask film by alternately supplying a first gas containing organic silicon and a second gas containing an activated oxygen species to the substrate;
   etching the silicon oxide film to thereby form the sidewall spacer on a sidewall of the patterned photoresist film;
   removing the patterned photoresist film;
   processing the hard mask film by using the sidewall spacer as a mask; and
   processing the second film by using the processed hard mask film as a mask.

3. The patterning method of claim 2, wherein the first film is an etching stopper film.

4. The patterning method of claim 2, wherein the processed second film is capable of functioning as a gate electrode, while the first film is capable of functioning as a gate insulating film.

5. The patterning method of claim 1, further comprising:
   trimming the patterned photoresist film.

6. The patterning method of claim 1, wherein the organic silicon is aminosilane.

7. The patterning method of claim 1, wherein the organic silicon is monovalent or divalent aminosilane.

8. The patterning method of claim 7, wherein the monovalent or divalent aminosilane is at least one selected from bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), diisopropylaminosilane (DIPAS), and bisethylmethylaminosilane (BEMAS).

9. The patterning method of claim 1, wherein the activated oxygen species is generated by exciting an oxygen-containing gas into plasma.

10. The patterning method of claim 9, wherein the oxygen-containing gas is at least one of an $O_2$ gas, a NO gas, a $N_2O$ gas, a $H_2O$ gas and an $O_3$ gas.

11. The patterning method of claim 1, wherein the silicon oxide film is formed in a processing chamber capable of being maintained under a vacuum by alternately performing a step of supplying the first gas into the processing chamber and a step of supplying the second gas into the processing chamber.

12. The patterning method of claim 11, further including a step of exhausting a residual gas in the processing chamber between the step of supplying the first gas into the processing chamber and the step of supplying the second gas into the processing chamber.

13. The patterning method of claim 12, wherein the step of exhausting the residual gas in the processing chamber is implemented by introducing a purge gas into the processing chamber while vacuum-evacuating the processing chamber.

14. The patterning method of claim 1, wherein when forming the silicon oxide film, a film forming temperature is below or equal to a heat resistant temperature of the photoresist film.

15. The patterning method of claim 14, wherein the film forming temperature is below or equal to about 100° C.

16. The patterning method of claim 2, further comprising:
trimming the patterned photoresist film.

17. The patterning method of claim 2, wherein the organic silicon is aminosilane.

18. The patterning method of claim 2, wherein the organic silicon is monovalent or divalent aminosilane.

19. The patterning method of claim 18, wherein the monovalent or divalent aminosilane is at least one selected from bistertiarybutylaminosilane (BTBAS), bisdimethylaminosilane (BDMAS), bisdiethylaminosilane (BDEAS), dimethylaminosilane (DMAS), diethylaminosilane (DEAS), dipropylaminosilane (DPAS), butylaminosilane (BAS), diisopropylaminosilane (DIPAS), and bisethylmethylaminosilane (BEMAS).

20. The patterning method of claim 2, wherein the activated oxygen species is generated by exciting an oxygen-containing gas into plasma.

21. The patterning method of claim 20, wherein the oxygen-containing gas is at least one of an $O_2$ gas, a NO gas, a $N_2O$ gas, a $H_2O$ gas and an $O_3$ gas.

22. The patterning method of claim 2, wherein the silicon oxide film is formed in a processing chamber capable of being maintained under a vacuum by alternately performing a step of supplying the first gas into the processing chamber and a step of supplying the second gas into the processing chamber.

23. The patterning method of claim 22, further including a step of exhausting a residual gas in the processing chamber between the step of supplying the first gas into the processing chamber and the step of supplying the second gas into the processing chamber.

24. The patterning method of claim 2, wherein when forming the silicon oxide film, a film forming temperature is below or equal to a heat resistant temperature of the photoresist film.

25. The patterning method of claim 24, wherein the film forming temperature is below or equal to about 100° C.

* * * * *